United States Patent
Inazu

(10) Patent No.: US 7,254,804 B2
(45) Date of Patent: Aug. 7, 2007

(54) METHOD OF VERIFYING CORRECTED PHOTOMASK-PATTERN RESULTS AND DEVICE FOR THE SAME

(75) Inventor: Takatoshi Inazu, Kanagawa-ken (JP)

(73) Assignee: Kabushiki Kaisha Toshiba (JP)

( * ) Notice: Subject to any disclaimer, the term of this patent is extended or adjusted under 35 U.S.C. 154(b) by 333 days.

(21) Appl. No.: 10/956,806

(22) Filed: Sep. 30, 2004

(65) Prior Publication Data

US 2005/0120325 A1 Jun. 2, 2005

(30) Foreign Application Priority Data

Nov. 27, 2003 (JP) ............................. P2003-396868

(51) Int. Cl.
*G06F 17/50* (2006.01)
(52) U.S. Cl. ............................................ 716/21; 716/5
(58) Field of Classification Search .................... 716/4, 716/19–21; 703/13; 430/5, 30, 311, 316
See application file for complete search history.

(56) References Cited

U.S. PATENT DOCUMENTS 6,208,469 B1 * 3/2001 Matsuura .................... 359/637
6,741,334 B2 * 5/2004 Asano et al. ................. 355/77
6,757,645 B2 * 6/2004 Chang et al. ................. 703/13
7,003,755 B2 * 2/2006 Pang et al. ................... 716/19
7,107,571 B2 * 9/2006 Chang et al. ................. 716/19

FOREIGN PATENT DOCUMENTS

| JP | 11-218899 | 8/1999 |
|----|-----------|--------|
| JP | 2000-260879 | 9/2000 |

* cited by examiner

*Primary Examiner*—Vuthe Siek
(74) *Attorney, Agent, or Firm*—DLA Piper US LLP

(57) ABSTRACT

A method of verifying photomask-pattern-correction results includes steps of cutting away photomask patterns of a region to be subjected to correction, forming photoresist models used for execution of an optical-proximity-effect-correction operation, executing the optical-proximity-effect-correction operation of the photomask patterns with respect to the photoresist models, executing an exposure simulation for simulating photoresist patterns formed on a photoresist film to which the photomask patterns are transferred after the optical-proximity-effect-correction operation, and designating parameters required for executions of the cutting away the photomask patterns of the region, the forming of the photoresist models, the optical-proximity-effect-correction operation, and the exposure simulation.

3 Claims, 18 Drawing Sheets

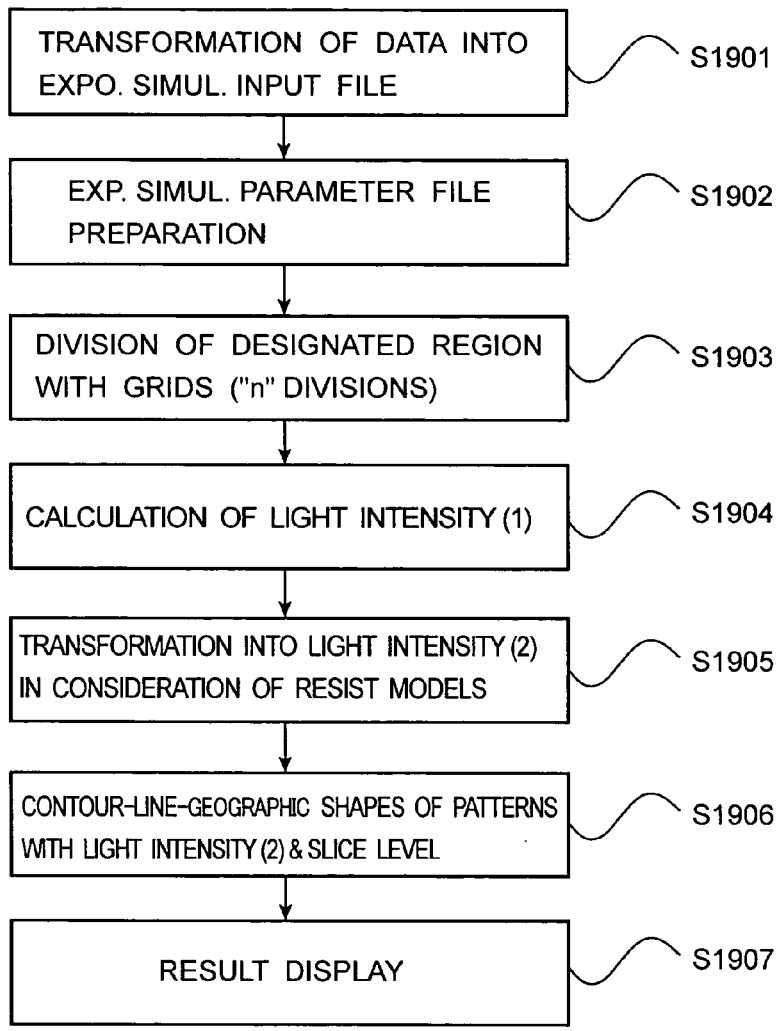
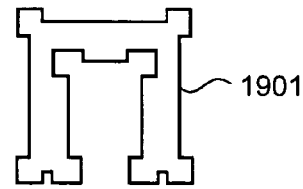
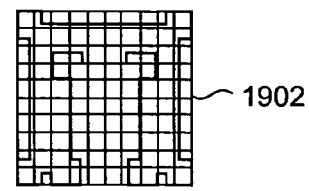
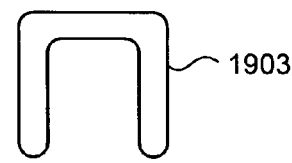
FIG. 5A
FIG. 5B

METHOD OF VERIFYING CORRECTED PHOTOMASK-PATTERN RESULTS AND DEVICE FOR THE SAME

CROSS-REFERENCE TO RELATED APPLICATIONS

This application is based upon and claims the benefit of priority from the prior Japanese Patent Application No. 2003-396868, filed on Nov. 27, 2003, the entire contents of which are incorporated in this application by reference.

FIELD OF THE INVENTION

This invention relates to a method of verifying corrected photomask-pattern results and a verification device for such corrected photomask-pattern results and, more particularly, to a method of verifying corrected photomask-pattern results applied to manufacturing large-scale-integrated-semiconductor circuits and a verification device for the same.

BACKGROUND OF THE INVENTION

Semiconductor devices become finer in structure as the integration of their integrated circuits is higher. As a result, optical proximity effects greatly influence differences between designed photomask-patterns, and photoresist patterns transferred from the designed photomask-patterns to a photoresist film on a device substrate.

Concretely, an originally designed right-angle corner of photomask-patterns actually becomes round on a photoresist film, or a line of photoresist patterns eventually formed is deformedly shorter in length at its end, or wider or narrower in width than that of the designed photomask-patterns.

Such a deviation of photoresist patterns from photomask-patterns deteriorates characteristics of semiconductor devices and/or the breaking down or forming of bridges of photoresist patterns causes substantially decline in yield rate of the semiconductor devices.

Thus, in order to obtain desired photoresist patterns, photomask-patterns are required to correct deviations or deformation to be possibly caused at the photoresist patterns in advance in consideration of optical-proximity effects. This process is called optical-proximity-effect corrections (the "OPC").

An OPC operation is carried out by using exposure simulators, which provide photoresist patterns in response to input data of photomask-patterns on a simulation basis.

The exposure simulators, however, basically cannot correct a line width of photomask-patterns, for example. Photomask design engineers make new photomask-patterns with a line width correction, for example, which are, in turn, supplied to the exposure simulators to check photoresist patterns and such operations are necessarily repeated to obtain preferable photoresist patterns. Obviously, it takes a long time to correct photomask-patterns and is burdensome for the engineers to fix them satisfactorily.

In order to overcome such technical difficulties, a prior art photomask-pattern correction device has been proposed in Japanese Unexamined Patent Publication Tokkai Hei 11-218899, for example. The prior art photomask-pattern-correction device will be briefly explained below with reference to FIG. 20.

The photomask-pattern-correction device performs the OPC operation as follows:

Exposure parameters, photomask-pattern-correction data and photomask parameters are provided to the photomask-pattern-correction device (Step 2101). The exposure parameters are, for example, designed photomask-patterns to be transferred to a photoresist film, exposure wave-length and intensity at an exposure process, and focus positions.

A bias process (Step 2102) is then carried out based on the photomask-pattern parameters with respect to the designed photomask-patterns provided at Step 2101. The bias process enlarges and decreases the photomask-patterns in the case of positive and negative values with respect to their order, respectively, but leaves the photomask-patterns as they are in the case of nil.

Subsequently, exposure simulation (Step 2103) is executed in terms of the photomask-patterns which has been subjected to the bias process in Step 2102, and deviations between the designed photomask-patterns and photoresist patterns transferred from them are detected and assessed (Step 2104) as output result data. In this process, since a certain fixed bias is simply applied to the designed photomask-patterns, the transferred photoresist patterns deviate to some extent from the designed photomask-patterns.

OPC operation (Step 2105) is executed based on the deviations detected in Step 2104 and such corrected photomask-patterns are then subjected to exposure simulations (Step 2106). Deviations of the transferred photoresist patterns further modified in Step 2106 from the designed photomask-patterns are assessed and detected (Step 2107). If such assessed results from Step 2107 are better than then optimum OPC patterns which have been stored before, the OPC patterns obtained from Step 2105 are newly stored as optimum OPC patterns (Step 2108).

Executions from Step 2105 through Step 2108 are repeated until predetermined conditions are satisfied by them so that the optimum OPC patterns are determined at that time.

Finally, photomask-pattern verification (Step 2109) is performed for the OPC patterns stored at Step 2108 as to whether their line widths and distances comply with design rules. After the correction of errors, if any, exposure simulation (Step 2110) is executed. Final assessment (Step 2111) is made for outputs of Step 2110 to complete the OPC operation.

Such a prior art photomask-pattern-correction device is configured to automatically obtain optimum OPC patterns but corrected data verification is not described in detail. In the OPC operation of photomask-patterns, one of its targets is to make OPC patterns but its output patterns do not always result in ideal ones for all the patterns, i.e., the OPC patterns are not always consistent with photoresist patterns transferred to a photoresist film. Thus, it is a realistic approach to set up certain critical conditions so that OPC patterns cannot be used unless and until the OPC patterns satisfy the critical conditions.

In short, a prior art photomask-pattern correction device is merely provided with a function to make up OPC patterns and it is insufficient to verify functions as to whether pattern data are truly suitable for the transfer to a photoresist film.

SUMMARY OF THE INVENTION

The first aspect of the present invention is directed to a method of verifying photomask-pattern-correction results provided with cutting away photomask patterns of a region to be subjected to correction, forming photoresist models used for execution of an optical-proximity-effect-correction operation, executing the optical-proximity-effect-correction operation of the photomask patterns with respect to the photoresist models, executing an exposure simulation for simulating photoresist patterns formed on a photoresist film to which the photomask patterns are transferred after the optical-proximity-effect-correction operation, measuring sizes of the photoresist patterns subjected to the exposure simulation, plotting exposure defocus trees and margin curves to show a relationship between exposure doses and defocus distances so that the photoresist patterns to which the photomask patterns are transferred after the optical-proximity-effect-correction operation are in a predetermined size, detecting deviations of the photoresist patterns from originally designed photomask patterns with respect to the photomask patterns after the optical-proximity-effect-correction operation, and designating parameters required for the cutting away the photomask patterns of the region, the forming of the photoresist models, the optical-proximity-effect-correction operation of the photomask patterns, the exposure simulation, the measuring of the sizes of the photoresist patterns, the plotting of the exposure defocus trees and margin curves, and the detecting of the deviations.

The second aspect of the present invention is directed to a method of verifying photomask-pattern-correction results is characterized in that the detecting of the deviations is executed before the executing of the exposure simulation, the measuring of the sizes of the photoresist patterns and the plotting of the exposure defocus trees and margin curves.

The third aspect of the present invention is directed to a photomask-pattern-correction-result-verification device, provided with a cutting unit configured to cut away photomask patterns of a region to be subjected to correction, a photoresist-model formation unit configured to form photoresist models for execution of an optical-proximity-effect-correction operation, a correction operation unit configured to execute the optical-proximity-effect-correction operation of the photomask patterns with respect to the photoresist models, a detection unit configured to detect deviations of the photoresist patterns from originally-designed-photomask-patterns with respect to the photomask patterns after the optical-proximity-effect-correction operation, a plotter configured to plot exposure defocus trees and margin curves to show a relationship between exposure doses and defocus distances so that the photoresist patterns to which the photomask patterns are transferred after the optical-proximity-effect-correction operation are in a predetermined size, a measurement unit configured to measure sizes of the photoresist patterns with respect to results of the exposure simulation, an exposure simulation unit configured to simulate photoresist patterns formed on a photoresist film to which the photomask patterns are transferred after the optical-proximity-effect-correction operation, a database storage configured to store the designed-photomask-patterns, the photomask patterns, parameters used for photomask-pattern-correction-result verification, data of the photomask-pattern-correction-result verification and the photoresist models, and a graphic-user interface configured to operate and display of the designed-photomask-patterns, the photomask patterns, the parameters used for photomask-pattern-correction-result verification, the data of the photomask-pattern-correction-result verification and the photoresist models.

BRIEF DESCRIPTION OF THE DRAWINGS

A more complete appreciation of the present invention and many of its attendant advantages will be readily obtained as the same becomes better understood by reference to the following detailed descriptions when considered in connection with the accompanying drawings.

FIG. 5A is an operation flow chart of an exposure simulation unit shown in FIG. 3.

FIG. 5B illustrates patterns formed in steps of the operation flow chart shown in FIG. 5A.

DESCRIPTION OF THE EMBODIMENTS

Figure 1:
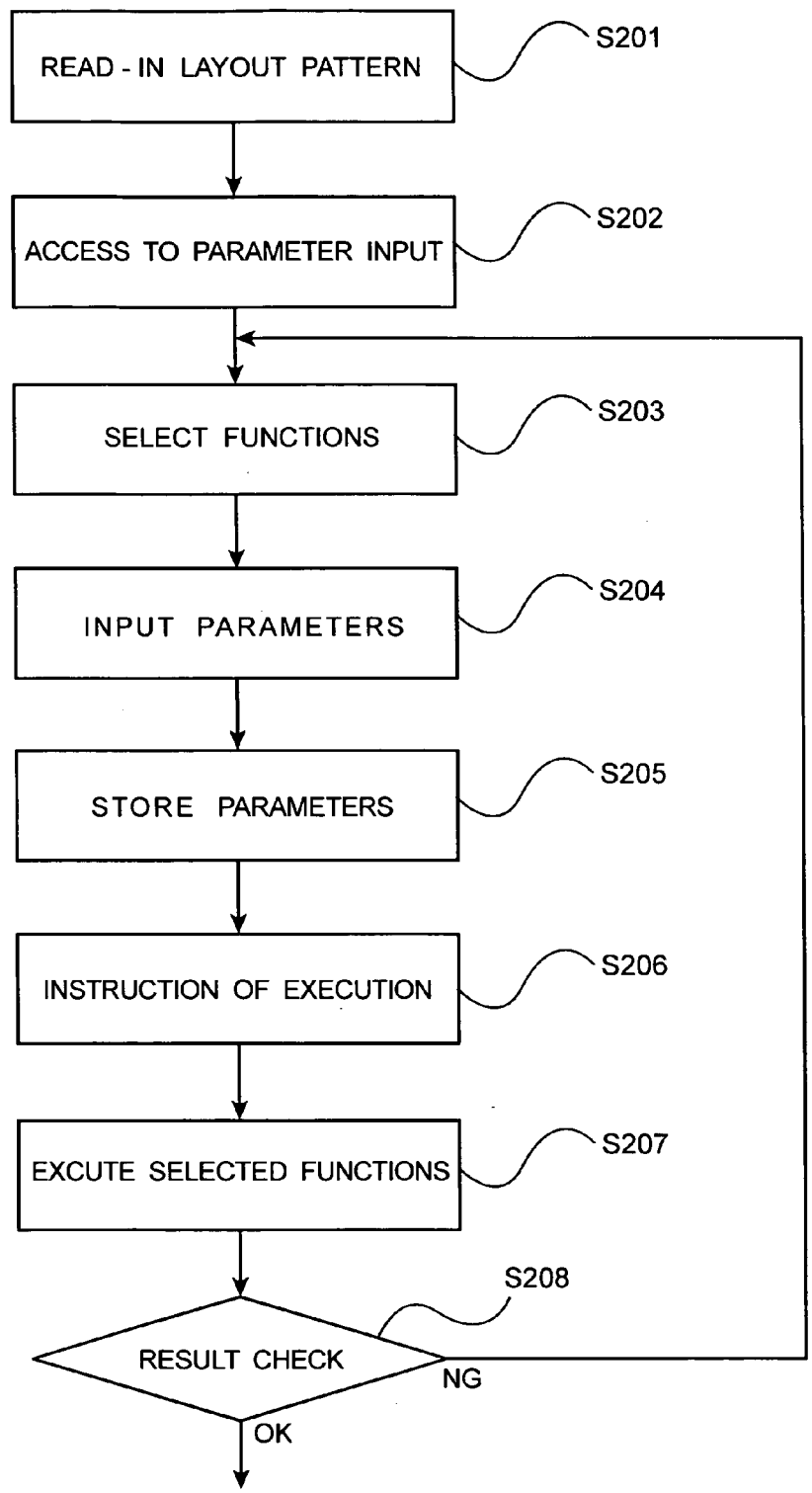
FIG. 1 is an operation flow chart for lithography engineers to review OPC patterns in accordance with the first embodiment of the present invention.

Embodiments of the present invention will be explained below with reference to the attached drawings. It should be noted that the present invention is not limited to the embodiments but covers their equivalents. Throughout the attached drawings, similar or same reference numerals show similar, equivalent or same components.

First Embodiment

FIG. 1 is an operation flow chart for lithography engineers to review OPC patterns by means of a method of verifying photomask-pattern-correction-results and/or a photomask-pattern-correction-result-verification device (collectively called the "correction verification system") in accordance with the first embodiment of the present invention. First, layout patterns are read in the correction verification system for the review of OPC patterns (Step S201).

Figure 2:
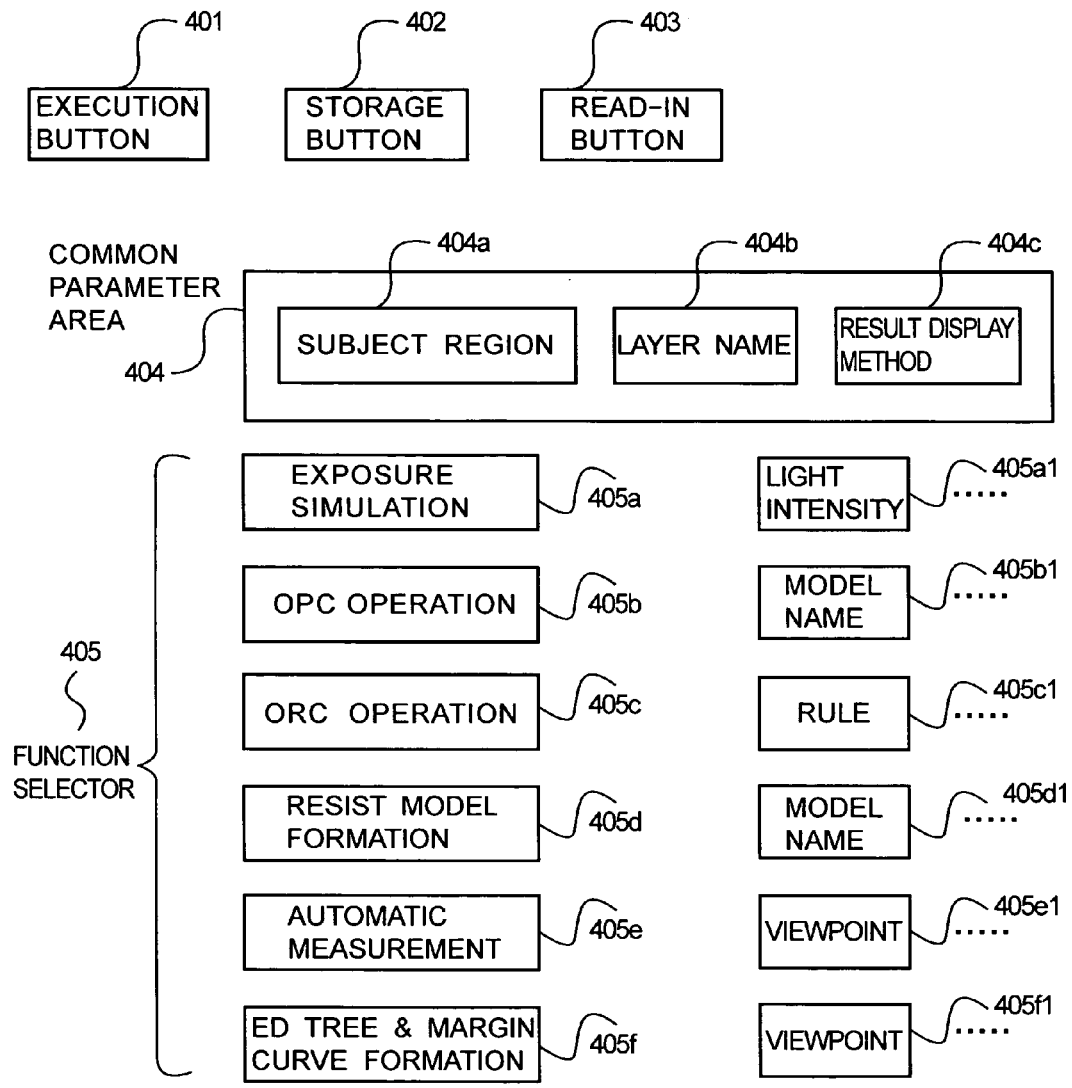
FIG. 2 is a block diagram of a parameter input unit in accordance with the first embodiment of the present invention.

Next, a parameter input unit is accessed (Step S202). FIG. 2 shows the parameter input unit provided with three kinds of buttons 401-403, common parameter area 404 and function selector 405. The buttons are execution button 401 for carrying out a selected function to be described later, storage button 402 for storing parameters provided to the parameter input unit, and parameter read-in button 403 for reading in parameters from a parameter storage unit.

Common parameter area 404 includes subject region 404a to be processed in response to common parameters, layer name 404b to indicate a processing data name, and result display method 404c. Subject region 404a designates coordinates of lower-left and upper right corners of a rectangular region, for instance. Result display method 404c specifies a display method on a layout editor, a print-out format or the like. Function selector 405 designates one of the functions to be processed from among exposure simulation 405a, OPC operation 405b, optical rule check ("ORC") operation 405c, resist model formation 405d, automatic measurement 405e and exposure defocus ("ED") tree and margin curve formation 405f. Next to those function keys, parameter windows are provided for the designation of parameters, such as light intensity 405a1, model name 405b1, rule 405c1, model name 405d1, viewpoint 405e1 and viewpoint 405f1, respectively.

Next, one or more functions are selected from six functions of function selector 405 for photomask-pattern-result verification (Step S203). Parameters required for such functions are provided (Step S204) to the correction verification system. Those parameters are stored at a parameter storage unit for repeated use from now on (Step S205). This is executed by the designation of storage button 402.

The functions selected by function selector 405 are subjected to the instruction of execution (Step S206). Thus, one or more functions are executed (Step S207). Results from the execution of the functions are displayed in response to result-display method 404c so that the results are checked (Step S208). The operations are completed if such results have no problems or are returned to the parameter input if the results have any problems, to then carry out function selections and/or designate parameters for functions, i.e., to repeat the operations from Step S203 or S204 through Step S207.

Operation of each function selected by function selector 405 will be described later on.

Figure 3:
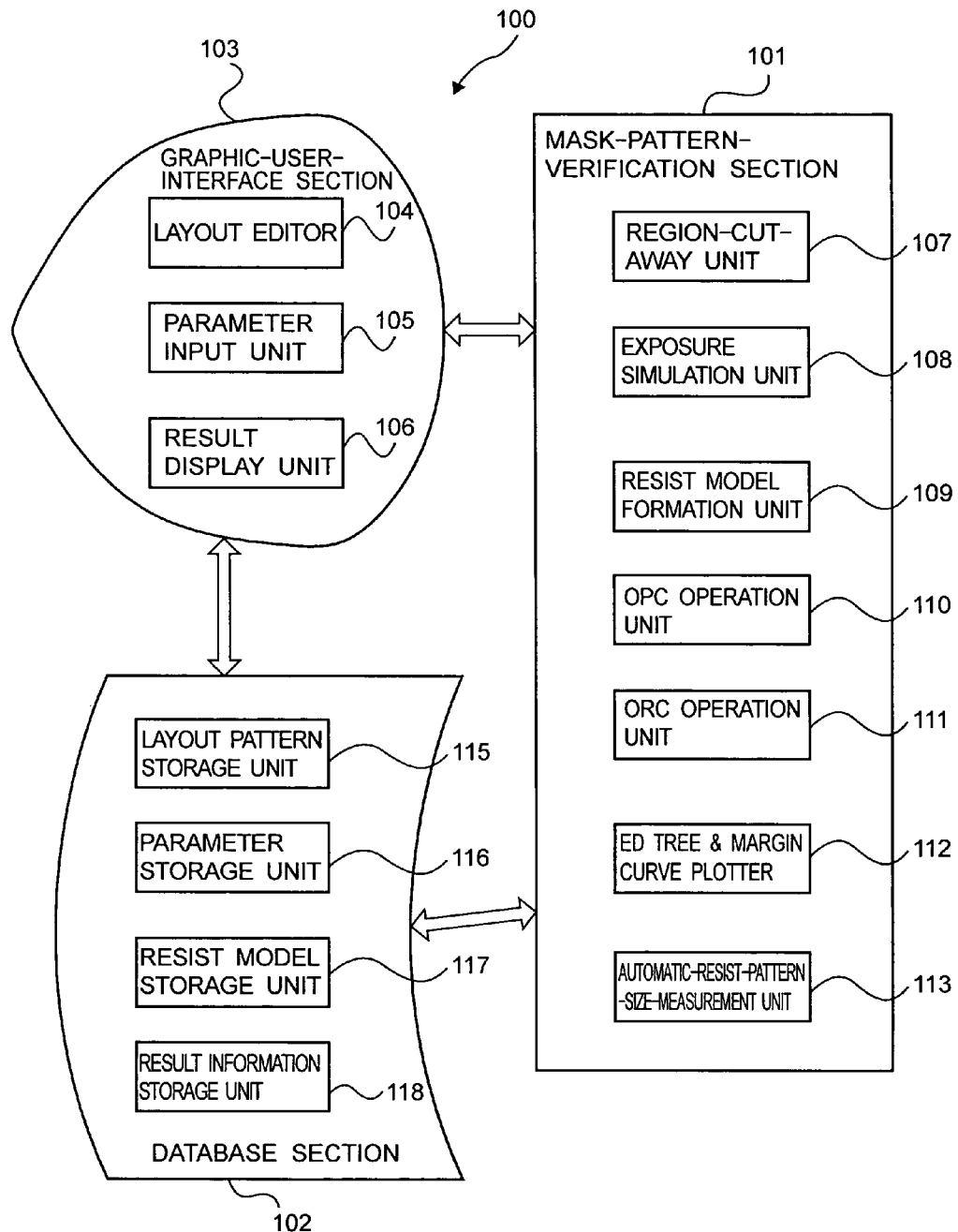
FIG. 3 is a block diagram of a photomask-pattern-correction-result-verification device in accordance with the first embodiment of the present invention.

FIG. 3 is a block diagram of photomask-pattern-correction-result-verification device 100 in accordance with the first embodiment of the present invention. Photomask-pattern-correction-result-verification device 100 is provided with photomask-pattern-verification section 101, database section 102, and graphic-user interface section 103.

Photomask-pattern-verification section 101 includes region cut-away unit 107, exposure simulation unit 108, photoresist-model formation unit 109, OPC operation unit 110, ORC operation unit 111, ED tree and margin-curve plotter 112 and automatic measurement unit 113. Region cut-away unit 107 extracts only subject operation data from photomask-pattern-verification section 101. Exposure simulation unit 108 executes an exposure simulation based on patterns in a designated region. Photoresist-model formation unit 109 forms a photoresist model for the exposure simulation to use the calculation of photoresist patterns. OPC operation unit 110 executes an OPC operation. ORC operation unit 111 checks deviations of actually formed photoresist patterns from originally designed photomask-patterns by means of the exposure simulation. ED tree and margin-curve plotter 112 make up ED trees and margin-curves to check exposure conditions and OPC operations. Automatic measurement unit 113 automatically measures sizes of photoresist patterns at designated points of the originally designed patterns.

Database section 102 includes layout pattern storage unit 115, parameter storage unit 116, resist-model storage unit 117 and result information storage unit 118.

Graphic-user interface 103 includes layout editor 104, parameter input unit 105 and result display unit 106. Layout editor 104 obtains to edit necessary layout patterns from database section 102. Parameter input unit 105 designates parameters used for operations executed by photomask-pattern-verification section 101. Result display unit 106 displays such results from OPC operations, ORC operations, automatic photoresist pattern measurement and ED trees and margin curves as executed by photomask-pattern-verification section 101.

Next, functions and operations of the sections in photomask-pattern-verification section 101 will be described below.

Figure 4A:
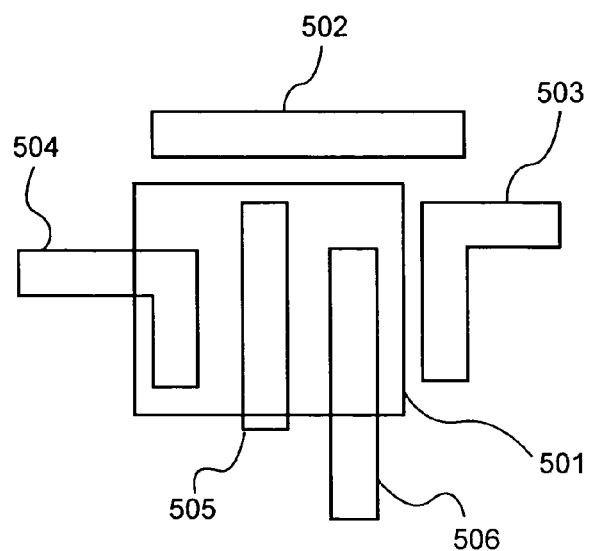
FIGS. 4A-4C show a photomask pattern of a part of an LSI circuit and a subject region, overlapping portions of the photomask pattern with the subject region, and cut-away portions for photomask-pattern-correction verification in accordance with the first embodiment of the present invention.
Figure 4B:
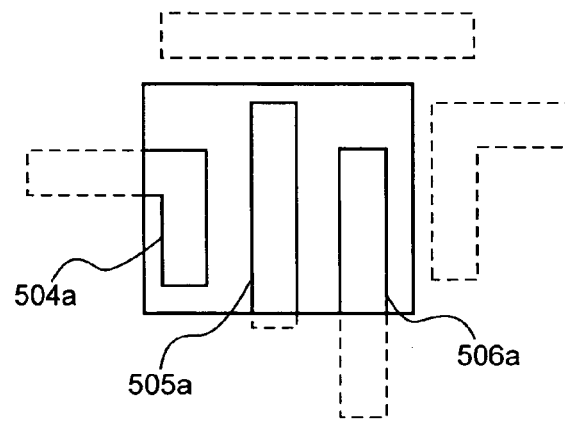
Figure 4C:
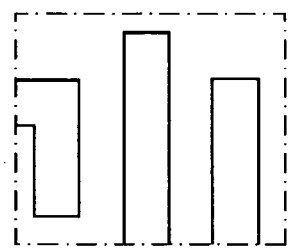

FIGS. 4A-4C are schematic photomask patterns to explain functions and operations of region-cut-away unit 107. Generally, since there are a great number of photomask patterns to fabricate large-scale-integrated (LSI) circuits, certain limited regions are extracted from the photomask patterns to increase operation efficiency in the case of the verification and modification of photomask-data. Thus, region-cut-away unit 107 extracts a region with geographic shapes from photomask patterns in such manners as shown in FIGS. 4A-4C. Region 501 shown in FIG. 4A is designated for the verification of photomask-pattern correction and is cut away from photomask-shapes 502-506 to constitute an LSI circuit pattern. With reference to FIG. 4B, since photomask-shapes 502 and 503 have no overlapping portions with region 501, they are discarded. Photomask-shapes 504-506 having overlapping portions with region 501 are extracted but only portions 504a, 505a and 506a are left in region 501. FIG. 4C shows subject photomask-shapes in region 501 left for the verification of photomask-pattern-correction.

Next, functions and operation of photoresist-model formation unit 109 will be described below. Here, photoresist models are made up to gain good OPC results for typical patterns so that photoresist patterns may become close to originally designed photomask-patterns.

Functions and operation of exposure simulation unit 105 will be described below with reference to FIGS. 5A, 5B and 6.

FIGS. 5A and 5B show an operation flow chart of exposure simulation unit 108 and photomask data and files in exposure simulation unit 108, respectively. First, photomask data 1901 included in the region subjected to the exposure simulation are transformed into an input file for the exposure simulation (Step S1901).

Next, exposure-simulation-parameter files are prepared (Step S1902). As shown in FIG. 6, exposure-simulation parameters include threshold value (slice level) 2001, illumination type (beam shape) 2002, beam diameter 2003, wave-length λ 2004, numerical aperture N/A 2005, defocus distance 2006, photomask type 2007, light transmittance 2008 of the photomask, light phase difference 2009 of the photomask and photoresist type 2010.

Exposure-simulation regions are then divided with grids (Step S1903). Here, ten divisions are provided in x- and y-axes (Step S1902 in FIG. 5). Light intensity (1) for each grid is calculated (Step S1904).

Light intensity (1) obtained from Step S1904 is transformed into light intensity (2) in consideration of photoresist models (fitting parameters) (S1905).

Next, contour lines 1903 of a threshold value (slice level) of light intensity (2) are prepared with respect to three dimensional graphs consisting of light intensity (2) and x- and y-planes (Step S1906). The contour lines define geographic shapes of patterns.

Finally, result patterns of the exposure simulation are displayed on result display unit 106 (Step S1907).

Figures 7A, 7B:
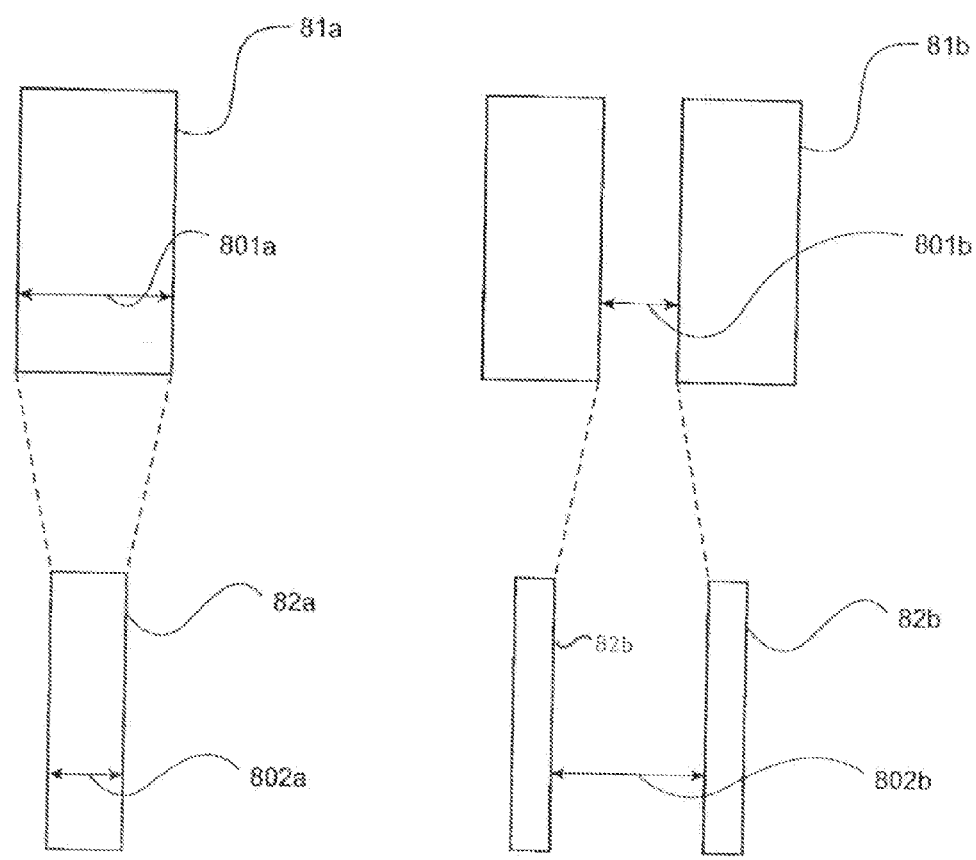
FIGS. 7A and 7B show relationships in width and distance between test-layout and photoresist patterns in accordance with the first embodiment of the present invention.

FIGS. 7A and 7B are schematic diagrams of methods for forming photoresist models. First, test-layout pattern 81a with designed width 801a is formed. Test-layout pattern 81a is then exposed to make photoresist pattern 82a width 802a formed on a photoresist film. Here, width 801a of test-layout pattern 81a is usually different from width 802a of pattern 82a as shown in FIG. 7A.

In the case, however, that an originally designed width of a photomask pattern is width 802a of pattern 82a and an OPC operation is applied to transform the same into width 801a of photomask pattern 81a, width 802a of pattern 82a is eventually formed on a photoresist film in accordance with such transformed width 801a of photomask pattern 81a as described immediately above in paragraph (0069). Thus, any desired widths of photoresist patterns may be obtained from this process.

The correction set forth above is directed to pattern widths but substantially the same correction can be applied to pattern intervals or distances, i.e., the OPC operation is also set up to transform interval 802b of originally designed photomask patterns 82b into interval 801b of photomask patterns 81b as shown in FIG. 7B. The accuracy of OPC operations is determined to some extent in accordance with that of internal exposure simulations. Photoresist models are determined by the corrections of a plurality of test patterns in such a way as shown in FIGS. 7A and 7B. The photoresist models are stored at resist-model storage unit 117 of database section 102.

Functions and operation of OPC operation unit 110 will be described below. Here, in order to obtain desired photoresist patterns, photomask patterns are corrected beforehand in consideration of optical proximity effects, i.e., the OPC (optical-proximity-effect-correction) operation is executed.

Figure 8A:
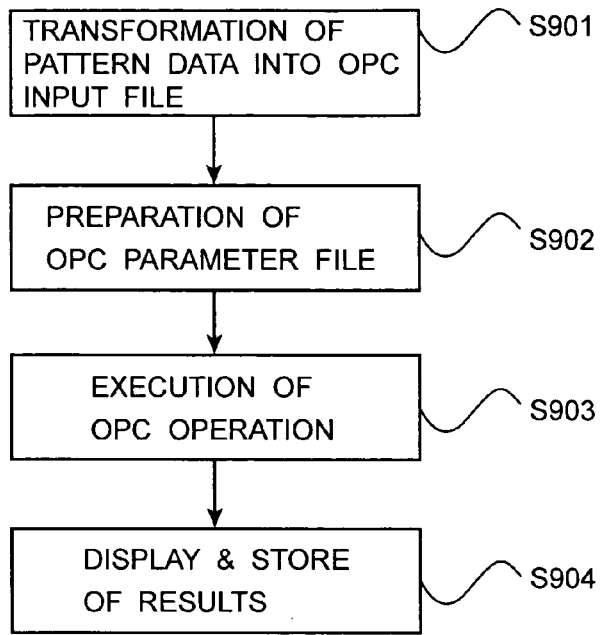
FIG. 8A is an operation flow chart of an OPC operation unit shown in FIG. 3.

FIG. 8A is an operation flow chart of OPC operation unit 110. First, the pattern data extracted by region-cut-away unit 107 are transformed into an OPC input file for the execution of the OPC operation (Step S901).

Figure 9:
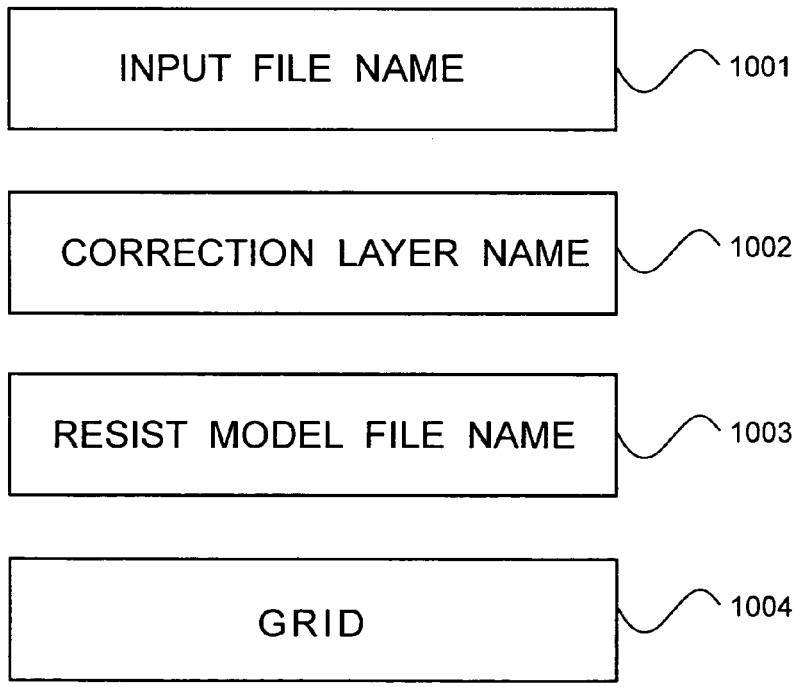
FIG. 9 show OPC parameters stored at a parameter storage of a database section shown in FIG. 3.

Next, an OPC parameter file is prepared (Step S902) and its parameters are stored at parameter storage unit 116 of database section 102. As shown in FIG. 9, the OPC parameters include input file name 1001 for subject correction data, layer name 1002 designated for the correction of specific patterns, photoresist model file name 1003 by which a stored photoresist model is specified, and correction grid 1004 for rounding data.

Figure 8B:
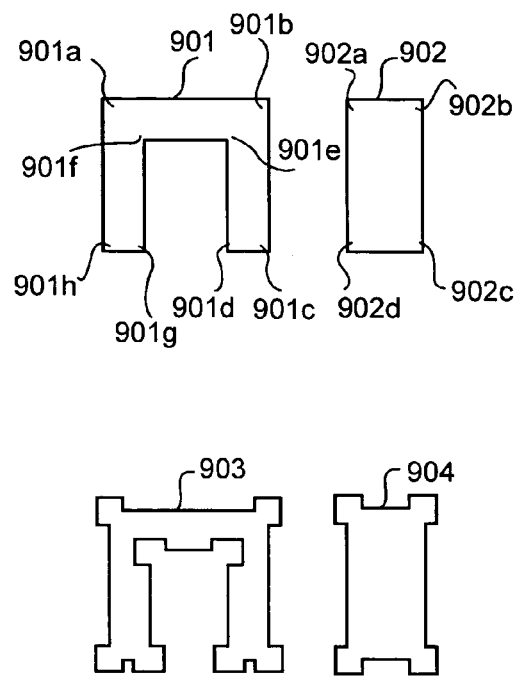
FIG. 8B illustrates patterns formed in steps of the operation flow chart shown in FIG. 8A.

Next, the OPC operation is executed (Step S903). FIG. 8B shows the OPC operation for patterns 901 and 902. Projected edge portions 901a, 901d, 901g, 901h, 902b and 902c or recessed edge portions 901e and 901f of patterns 901 and 902 are easily subjected to the optical-proximity-effect-correction (OPC). In consideration of such fact and interference between adjacent pattern portions 901b and 901c of pattern 901 and those 902a and 902d of patterns 902, respectively, the OPC operation is executed for patterns 901 and 902 with the exposure simulation carried out by making use of the photoresist models to obtain patterns 903 and 904, respectively.

Finally, OPC operation results are displayed on result display unit 106 of graphic-user interface section 103 and are stored at result information storage unit 118 of database section 102 (Step S904).

Next, functions and operation of ORC operation unit 111 will be described below. Here, the exposure simulation is executed for photomask patterns to which the OPC operation has been executed and deviations of photoresist patterns as a result of the exposure simulation from the originally designed photomask patterns are checked to confirm whether the OPC operation has been properly executed.

Figure 10A:
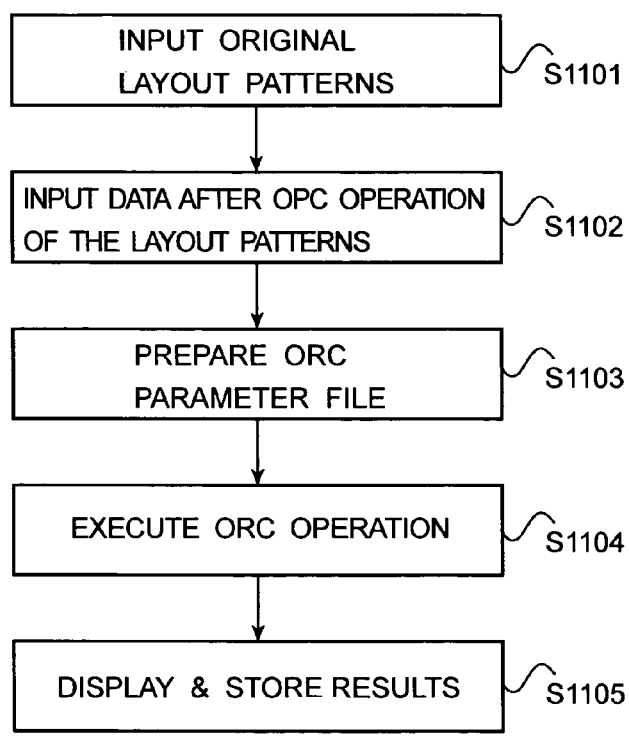
FIG. 10A is an operation flow chart of an optical rule check operation unit shown in FIG. 3.
Figure 10B:
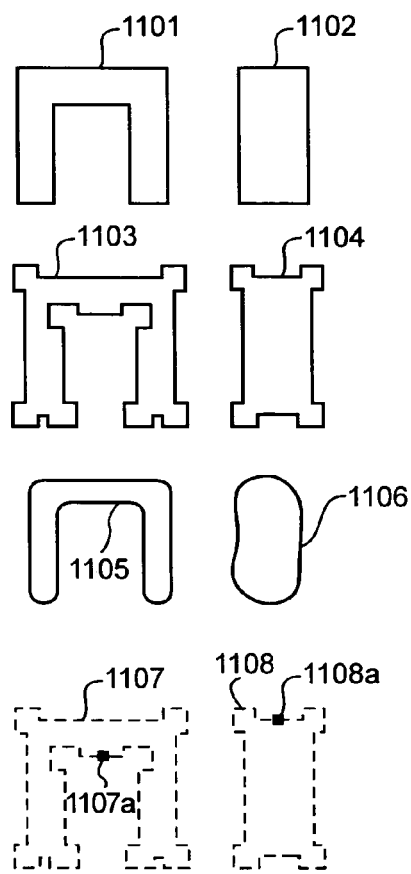
FIG. 10B illustrates patterns formed in steps of the operation flow chart shown in FIG. 10A.

FIG. 10A is an operation flow chart of ORC operation unit 111. First, the originally designed (or original layout) photomask patterns are provided to ORC operation unit 111 (Step S1101). Here, patterns 1101 and 1102 shown in FIG. 10B are assumed to be the originally designed patterns. Photomask patterns made by OPC operation unit 110 as a result of the application of the OPC operation to the designed patterns are then provided to ORC operation unit 111 (Step S1102). Here, patterns 1103 and 1104 for example are regarded as data to which the OPC operation has been applied.

Next, an ORC parameter file is prepared (Step S1103). The ORC parameters are rules or the like with respect to the scope of deviations to be extracted in the case of comparison of the originally designed photomask patterns with photoresist patterns subjected to the exposure simulation.

The ORC operation is then executed (Step S1104). Concretely, the exposure simulation is executed with respect to input photomask patterns 1103 and 1104 provided and then subjected to the OPC operation in Step S1102. As a result, patterns 1105 and 1106 are obtained as if photomask patterns were transferred to those formed on the photoresist film.

Patterns 1101 and 1102 are compared with those of 1105 and 1106, respectively, and their deviations are calculated. Only those with which requirements of the rules are satisfied are extracted from the deviations and are stored at result information storage unit 118 together with their position data.

Finally, base on such position data and deviations, only error portions 1107a and 1108a of patterns 1107 and 1108 are displayed on result display unit 106 of graphic-user interface section 103 as ORC operation results, respectively, which are stored at result information storage unit 118 (Step S1105).

Next, functions and operation of ED tree and margin curve plotter 112 will be described below.

The ED tree is a graph to show requirements between exposure doses and defocus distances for which sizes of photoresist patterns at specific viewpoints are in certain ranges at the exposure operation.

Figure 11:
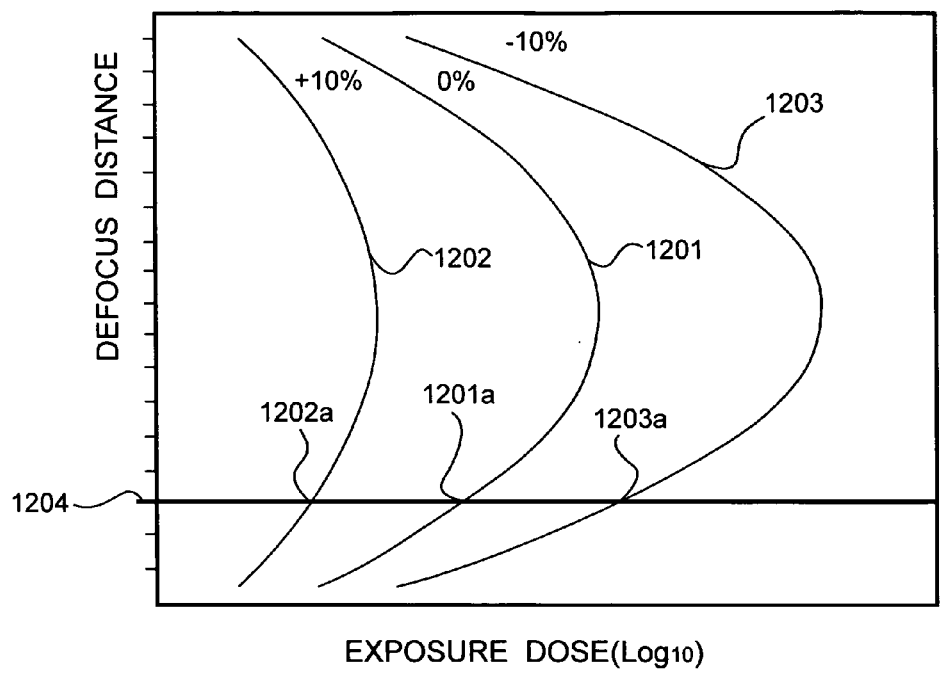
FIG. 11 illustrates ED trees and margin-curves plotted by ED tree and margin-curve plotter shown in FIG. 3.

FIG. 11 shows ED trees plotted by ED tree and margin curve plotter 112. Horizontal and vertical axes of the ED trees represent a common logarithm of an exposure dose and a defocus distance, respectively. Usually, a set of ED trees consists of three kinds of graphs which represent deviations 1201, 1202 and 1203 of 0%, +10% and −10% from the desired photoresist pattern sizes with respect to specific viewpoints.

A rectangle defined by two graphs (here, those of 1202 and 1203 provided with deviations of +10% and −10% from the desired photoresist-pattern sizes between exposure doses and defocus distances, respectively) is called a window.

Figure 12:
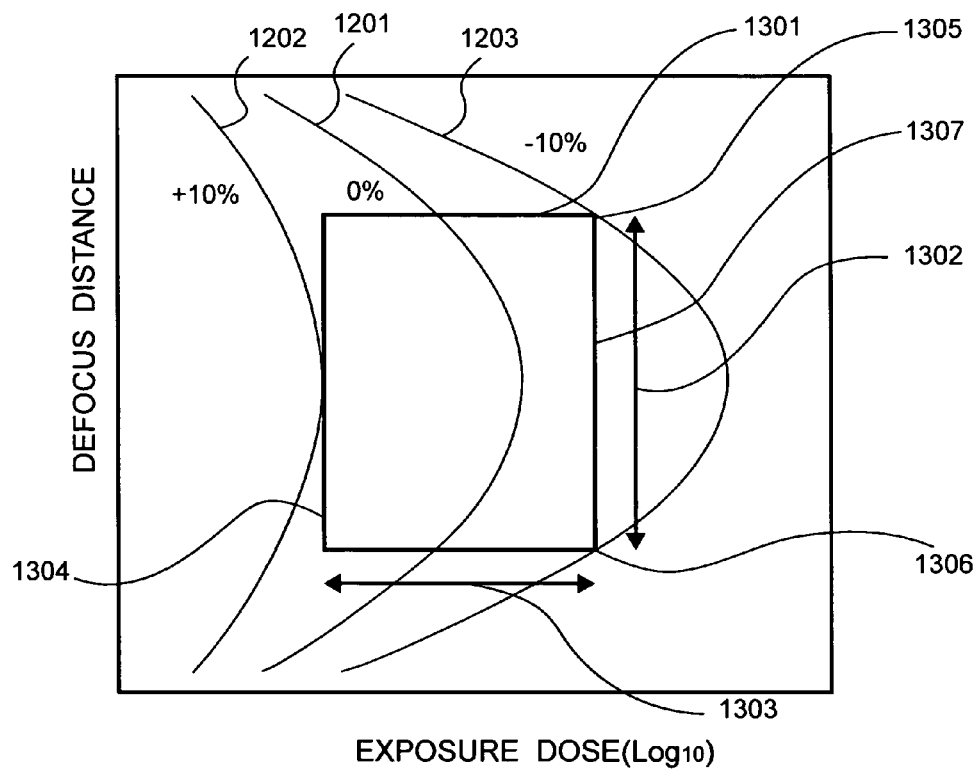
FIG. 12 illustrates a window defined with the ED trees shown in FIG. 11.
Figure 13A:
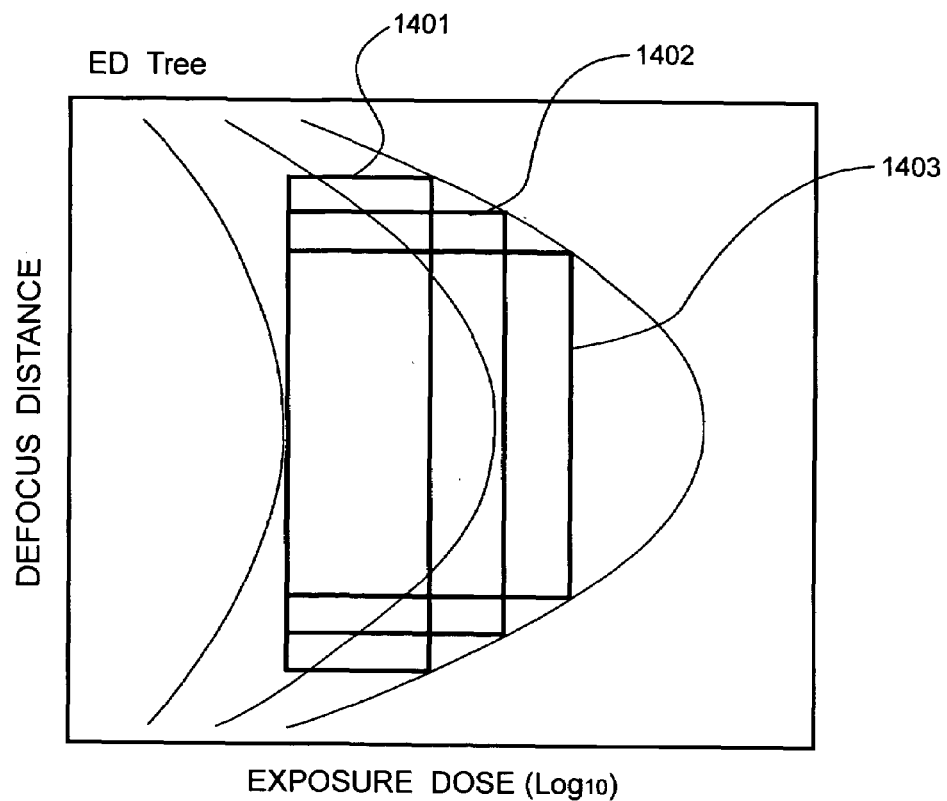
FIG. 13A illustrates the other windows defined with the ED trees shown in FIG. 11.
Figure 13B:
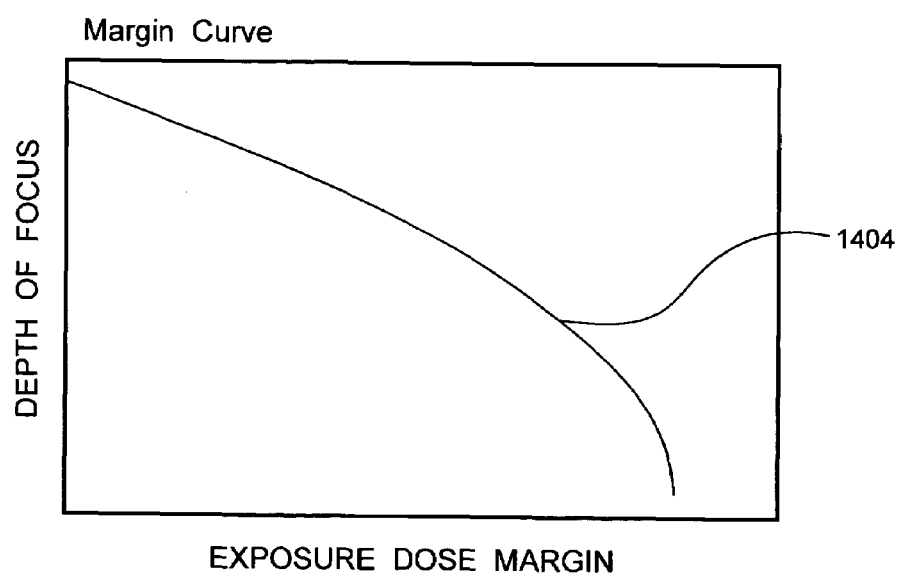
FIG. 13B illustrates a margin curve defined with the ED trees shown in FIG. 13A.

FIG. 12 shows window 1301 as defined above. Vertical and horizontal sides 1302 and 1303 are referred to as focus and exposure dose tolerances, respectively. There are innumerable windows defined by the two graphs but a margin curve is shown in the form of a graph with vertical and horizontal sides (defocus and exposure dose tolerances) of each rectangle. FIGS. 13A and 13B show windows 1401, 1402 and 1403 and margin curve 1404, respectively.

Figure 14A:
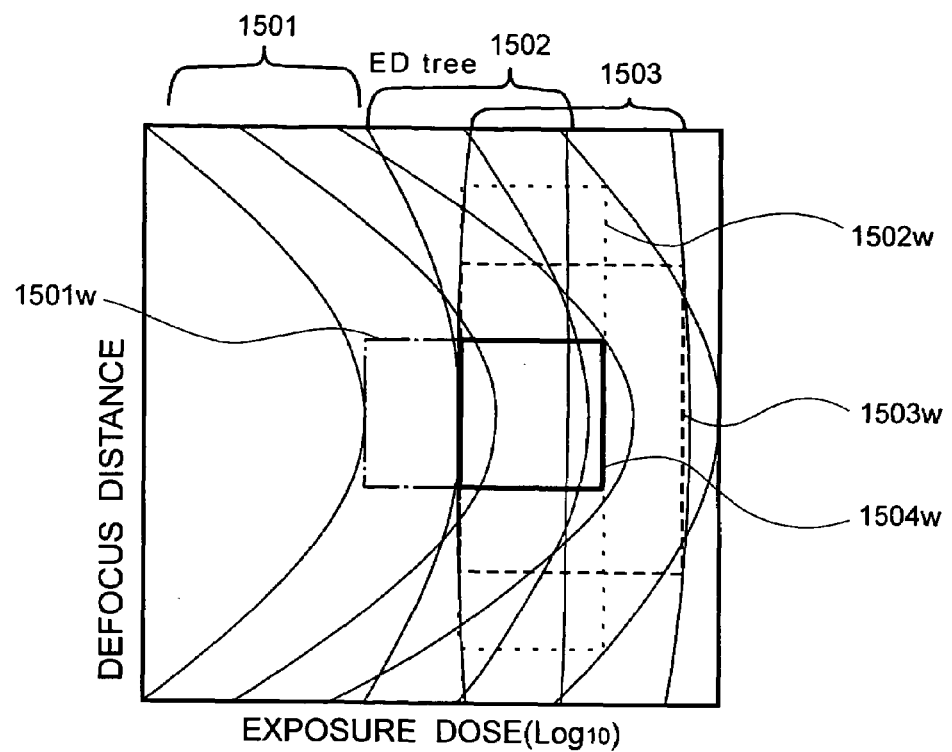
FIGS. 14A and 14B represent ED trees and margin curves with respect to a plurality of viewpoints, respectively, in accordance with the first embodiment of the present invention.
Figure 14B:
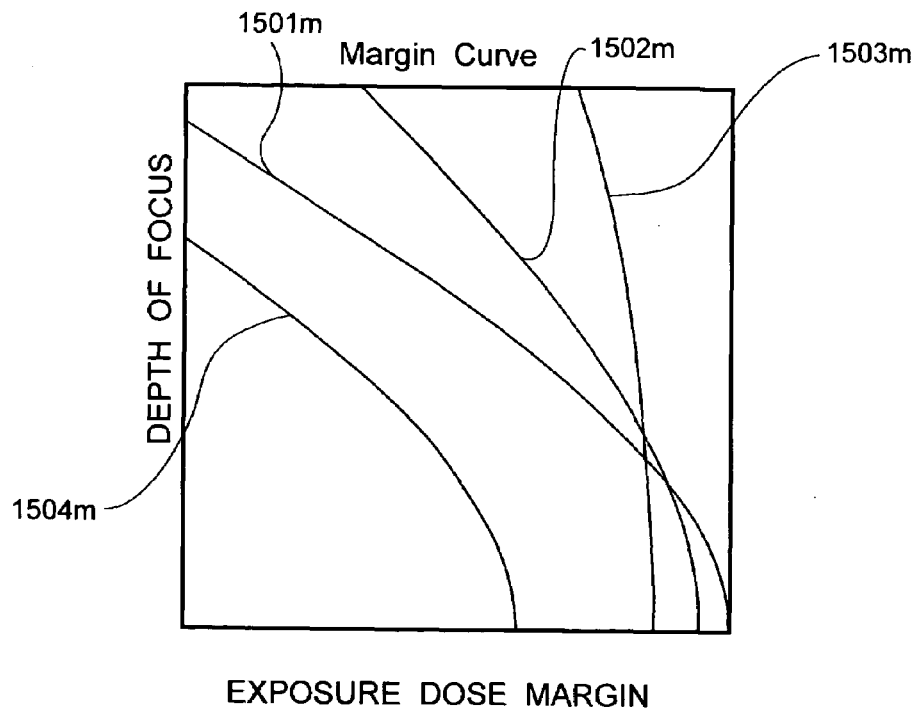

The ED trees and margin curves described above are merely based on one viewpoint but those shown in FIGS. 14A and 14B represent ED trees and margin curves with respect to a plurality of viewpoints. ED trees and windows 1501 and 1501w, 1502 and 1502w, and 1503 and 1503w are plotted at the first, second and third viewpoints, respectively. Margin curves 1501m, 1502m and 1503m are also drawn at the viewpoints. Further, three windows 1501w, 1502w and 1503w are overlapped to define common window 1504w and margin curve 1504m.

When design engineers correct actual photomask patterns, it is quite important to check whether a plurality of viewpoints comply with requirements for dispersion of the process in question. Common margin curve 1504m is often utilized to check such compliance. Since focus margins increase as exposure dose margins decrease and, vice versa, optimum points of both focus and exposure dose margins can be chosen by using common margin curve 1504m.

Figure 15:
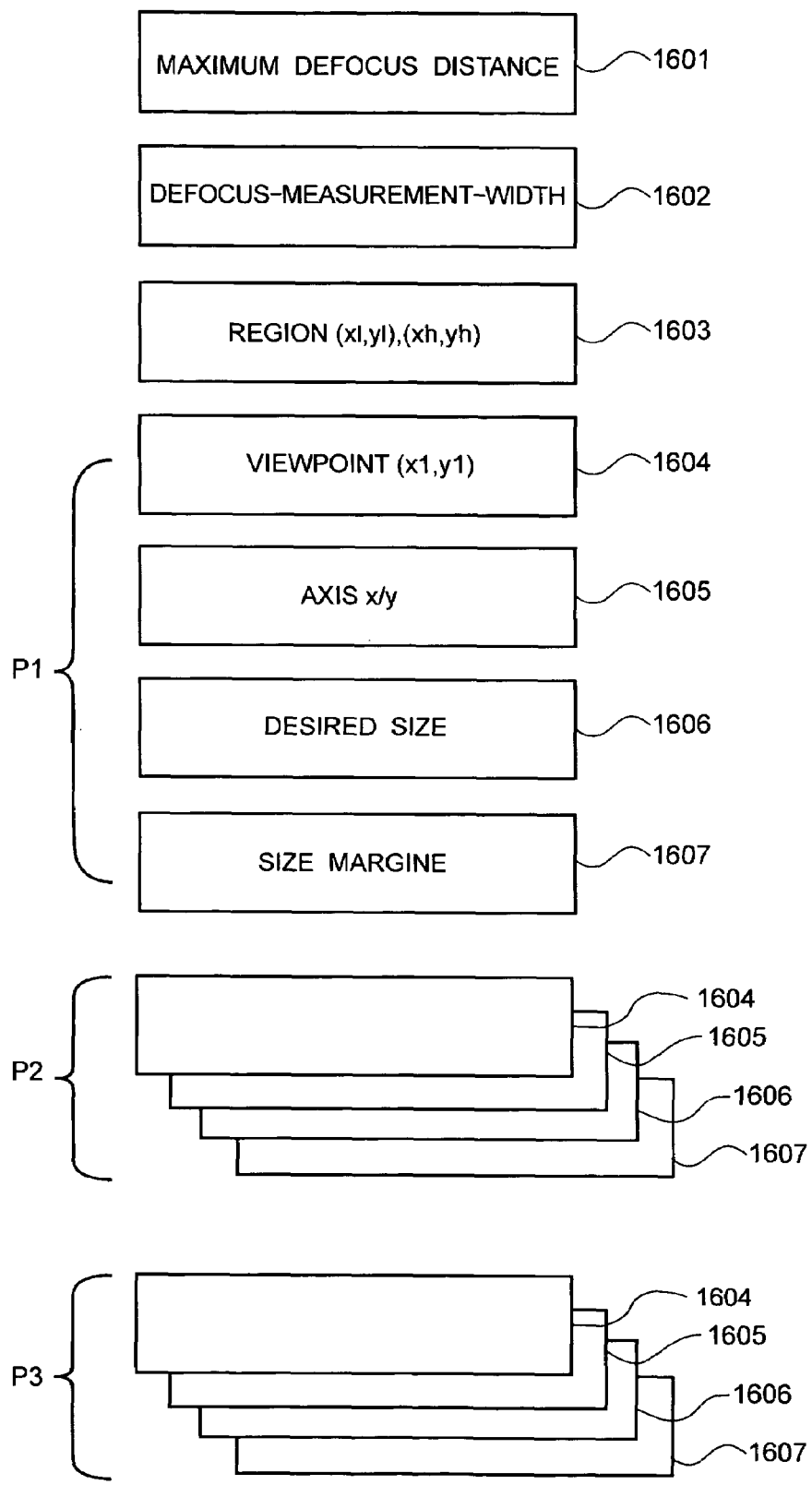
FIG. 15 shows parameters to define ED trees.

FIG. 15 shows parameters to define ED trees, which set up maximum defocus distance 1601, defocus-measurement width 1602, coordinates (xl,yl), (xh,yh) of subject region 1603 containing a pattern to define an ED tree, coordinates 1604 of a viewpoint for the pattern, an x- or y-axis 1605 to determine a pattern width at coordinates 1604, desired size 1606 of the pattern at the viewpoint, and size margin 1607. As shown in FIG. 15, three packages P1-Ps are provided in the case of three viewpoints, each of which includes those of 1604-1607.

Further, such parameters 1604-1607 are designated for a plurality of viewpoints in compliance with portions of patterns required for specific accuracy to avoid dispersion of the process. Those parameters are stored at parameter storage unit 116 of database section 102.

Figure 16:
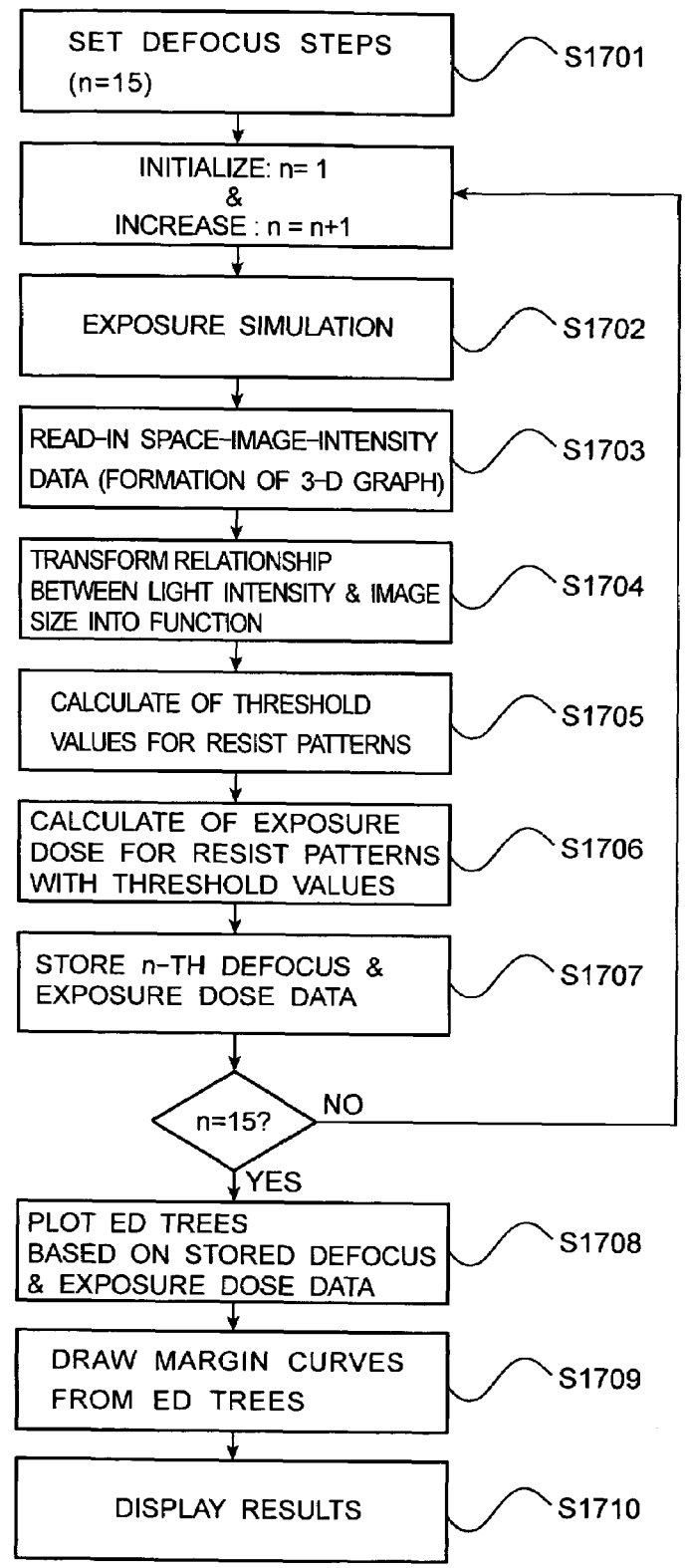
FIG. 16 is a flow chart to plot ED trees and margin curves.

FIG. 16 is a flow chart to draw ED trees and margin curves. Concrete operations in detail are described will be described with reference to FIGS. 11-15 as well. First, defocus steps "n" are determined in accordance with maximum defocus distance 1601 and defocus-measurement-width 1602 (Step S1701). Here, the defocus steps are set at n=15.

Next, the following operations are repeated until the focus steps are completed. The exposure simulation is executed for patterns which are included in subject region 1603 shown in FIG. 15 and cover those to define an ED tree (Step S1702).

The exposure simulation is omitted here because it will be detailed later.

Next, two-dimensional-space-image-intensity data are read in from results obtained from the exposure simulation. A three-dimensional graph with respect to such two-dimensional data is further defined with light intensity as an additional axis (Step S1703).

Subsequently, viewpoint coordinates 1604 of patterns to define the ED tree shown in FIG. 15 and a two-dimensional graph corresponding to x- or y-axis 1605 to determine pattern widths at the coordinates are extracted from the three-dimensional graph so that the relationship between light intensity and image sizes formed on a photoresist film is transformed into a function (Step S1704).

Next, in accordance with the function obtained from Step S1704, a threshold value of a desired size 1606 shown in FIG. 15 and threshold values with upper and lower limits (here, +10% and −10%) of size margins are calculated for pattern sizes on the photoresist film (Step S1705).

An exposure dose corresponding to each of the three threshold values is then calculated from a function (Step S1706) which is defined as [an exposure dose=1/(a threshold value)].

Subsequently, three values of the exposure doses obtained from Step S1706 and their defocus distances are temporarily stored at a file until operations of all the defocus distances are completed (Step S1707).

Until the operations described above are executed for all the defocus distances, the operation after Step S1707 is returned to Step S1702. After the completion of all the operations for Steps S1702-S1707, an ED tree is defined in accordance with the defocus distances and the exposure doses temporarily stored at the file for the desired size and ones with upper and lower margins (Step S1708).

With reference to FIG. 11, the vertical axis represents defocus distances which are equally divided into "n" sections (here, n=15) and the horizontal axis is assigned to exposure doses. With respect to the i-th defocus distance 1204, (i=1, 2, 3, . . . , 15), exposure dose 1201a for a desired size of a pattern formed on a photoresist film, exposure dose 1202a for the size with +10% margin and exposure dose 1203a for that with −10% margin are obtained from curves shown in FIG. 11.

When all values of the exposure dose with respect to the first defocus distance through the 15-th one are obtained and connected with each other, ED trees of two-dimensional graphs 1201, 1202 and 1203 are drawn to indicate the relationships between the defocus distances and the exposure doses.

Next, margin curves are derived from the ED curves obtained from Step S1708 (Step S1709). Rectangular window 1301 is shown in FIG. 12. Straight line 1304 is circumscribed at the vertex of graph 1202 and is in parallel with the y-axis. Graph 1202 shows the relationship between the exposure dose and the defocus distance in the case of a size with +10% margin. An arbitrary y-axis is crossed with graph 1203 at two points 1305 and 1306. Graph 1203 shows the relationship between the exposure dose and the defocus distance in a case of the size with −10% margin. Rectangular window 1301 is defined between graphs 1202 and 1203 and by straight lines extending from crossed points 1305 and 1306 along x- and y-axes and straight line 1304 in parallel with straight line 1307.

This rectangular window can be drawn in countless numbers by shifting straight line 1307 in parallel with the X-axis. Height 1302 and width 1303 of rectangular window 1301 are plotted on the vertical and horizontal axes as focus and exposure-dose margins, respectively, so that margin curve 1404 is drawn as shown in FIG. 13B.

Finally, the ED trees and margin curves are displayed on result display unit 106 (Step S1710).

Next, functions and operation of automatic measurement unit 113 will be described below. Here, sizes of photoresist patterns transferred from a photomask to a photoresist film after execution of the OPC operations are obtained from the exposure simulation and their results are then examined.

Figure 17:
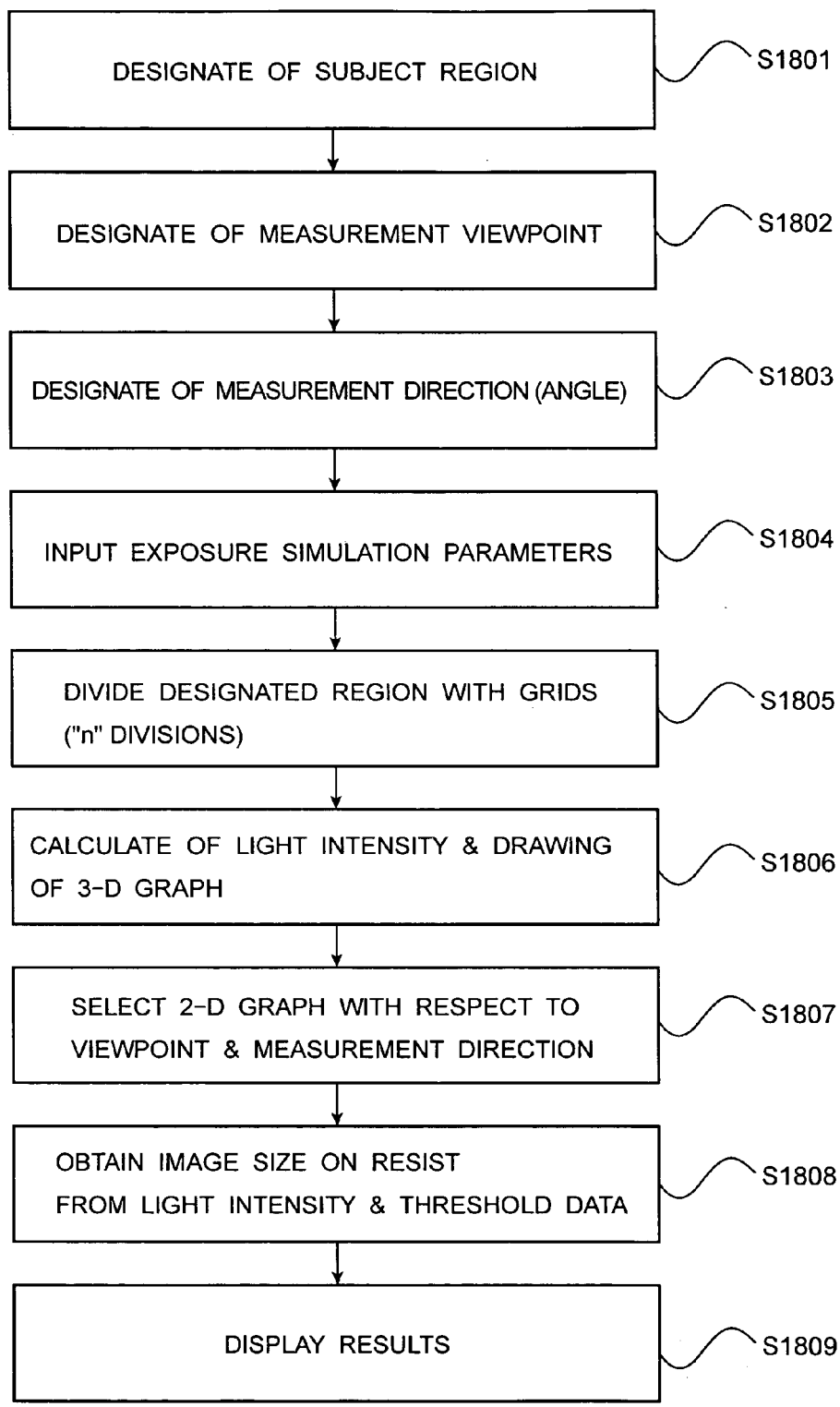
FIG. 17 is an operation flow chart of an automatic measurement unit shown in FIG. 3.
Figure 18A:
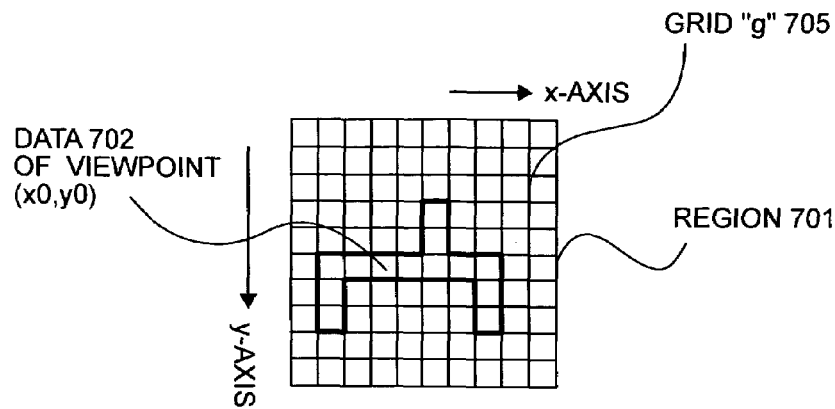
FIG. 18A shows a photoresist pattern to be measured by the automatic measurement unit shown in FIG. 3.
Figure 18B:
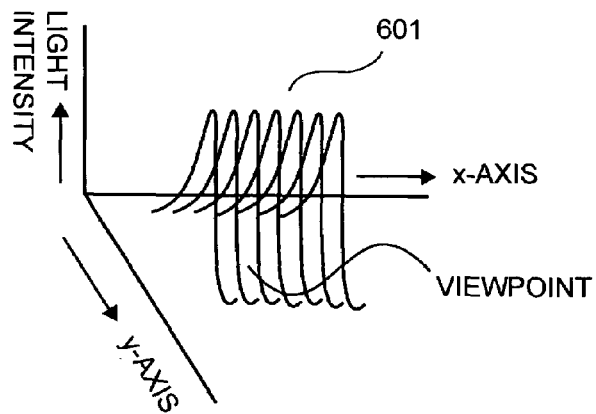
FIG. 18B shows three-dimensional distributions of light intensity with respect to viewpoints in accordance with the first embodiment of the present invention.

FIG. 17 is an operation flow chart of automatic measurement unit 113. With reference FIGS. 18 and 17, a photoresist pattern-size-measurement operation is described here in the case of certain exposure conditions and, particularly, specific light intensity (e.g., C0).

First, coordinates (x1, y1) and (x2, y2) of rectangular region (data) are designated to cover patterns subjected to measurement (Step S1801 in FIG. 17). Viewpoint coordinates (x0, y0) are then designated (Step S1802).

Next, a measurement direction is designated (Step S1803). This is a measurement angle with respect to the viewpoint coordinates (x0, y0) designated in Step S1802 (e.g. 90° with respect to the x-axis).

Figure 6:
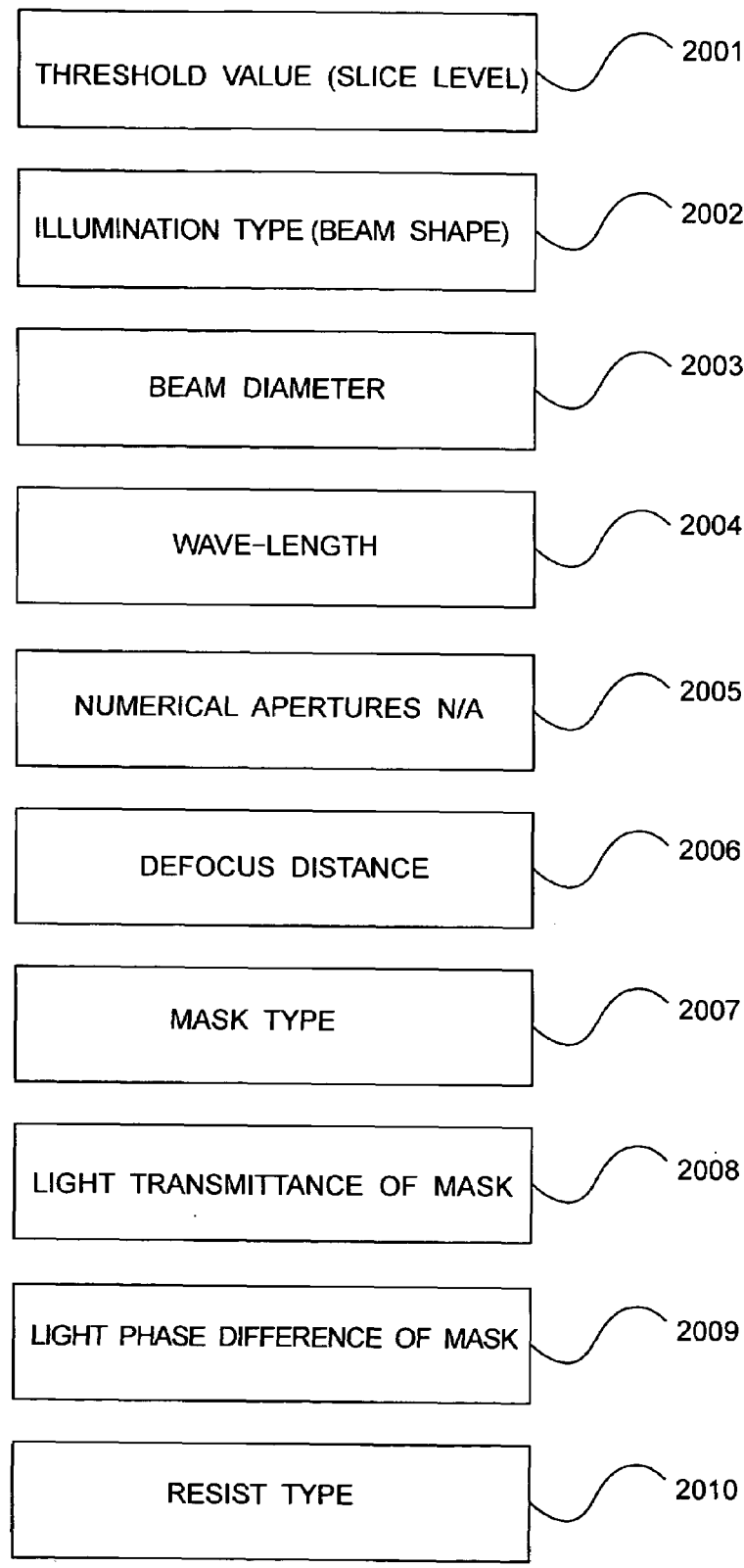
FIG. 6 shows exposure-simulation parameters in accordance with the first embodiment of the present invention.

Next, exposure simulation parameters shown in FIG. 6 are set (Step S1804). Their contents are omitted here because the exposure simulation unit 108 has been already described above.

Light intensity is divided into "n" sections (Step S1805). Light intensity at each grid of the rectangular region is then obtained from the exposure simulation to make up three-dimensional graph 601 shown in FIG. 18B (Step S1806).

A two-dimensional graph corresponding to a divided cross-section is selected from three-dimensional graph 601. The divided cross-section includes viewpoint coordinates (x0, y0) of a pattern, the image sizes of which are measured. In other words, the divided cross-section includes point y0 in a 90° direction with respect to the x-axis (Step S1807).

Figure 18C:
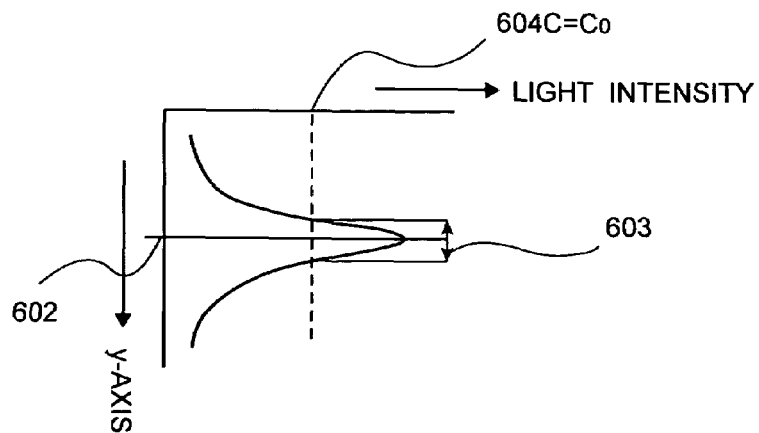
FIG. 18C shows two-dimensional distributions of light intensity with respect to a viewpoint shown in FIG. 18B.

Next, length 603 of a line segment cut away from the two-dimensional graph at light intensity 604=C0 and viewpoint 602 is obtained as shown in FIG. 18C (Step S1808). This is a size of the pattern formed on the photoresist film.

Finally, the photoresist pattern size obtained in Step S1808 is displayed on result display unit 106 (Step S1809).

As described above, when lithography engineers determine various photomask-pattern parameters for a specific process, necessary functions are accessed and executed through an integrated user interface so that storing operations of executed results, finally determined parameters and the like are automatically performed.

Second Embodiment

Figure 19:
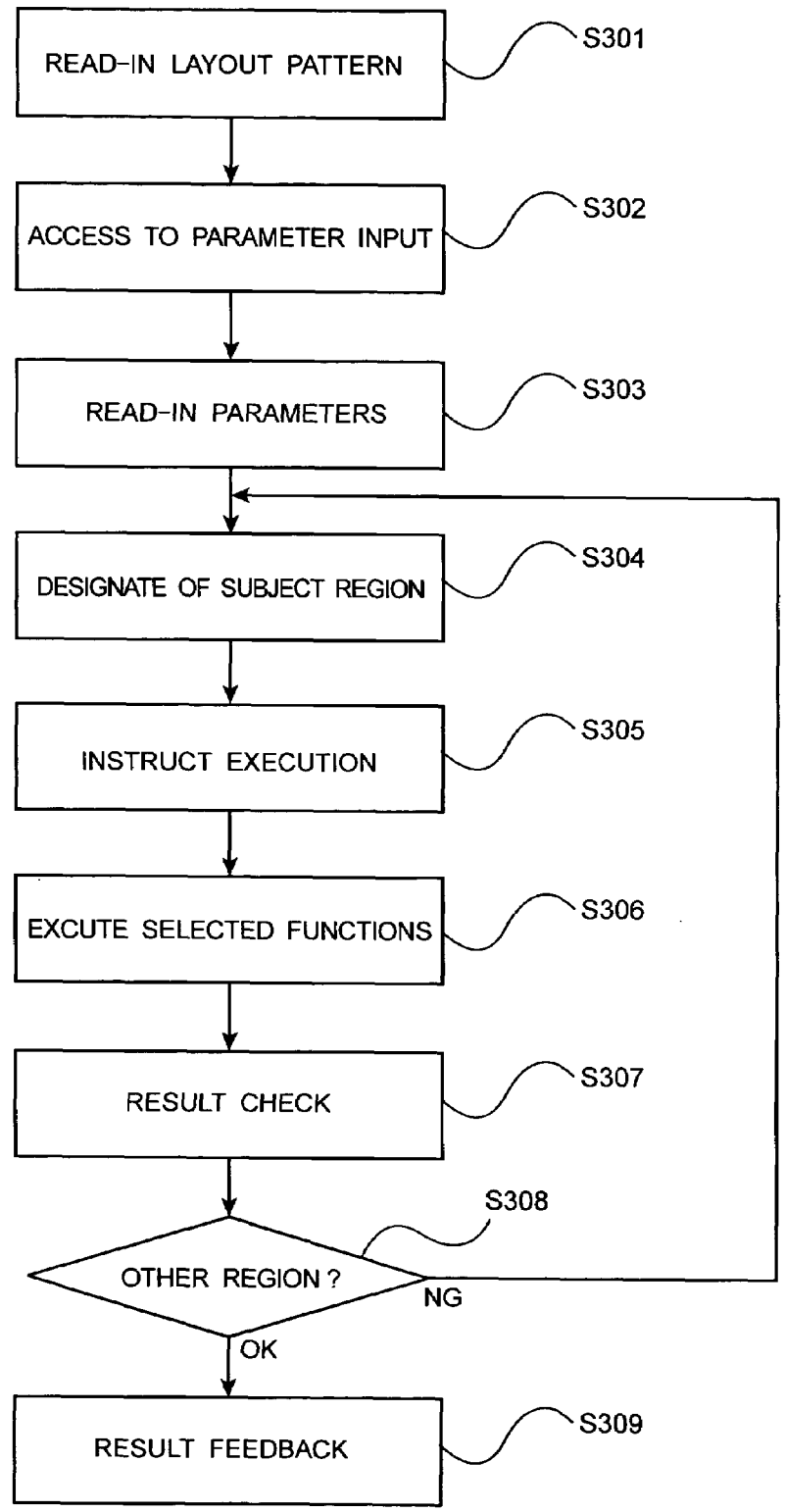
FIG. 19 is a block diagram of a photomask-pattern-correction-result-verification device in accordance with the second embodiment of the present invention.
Figure 20:
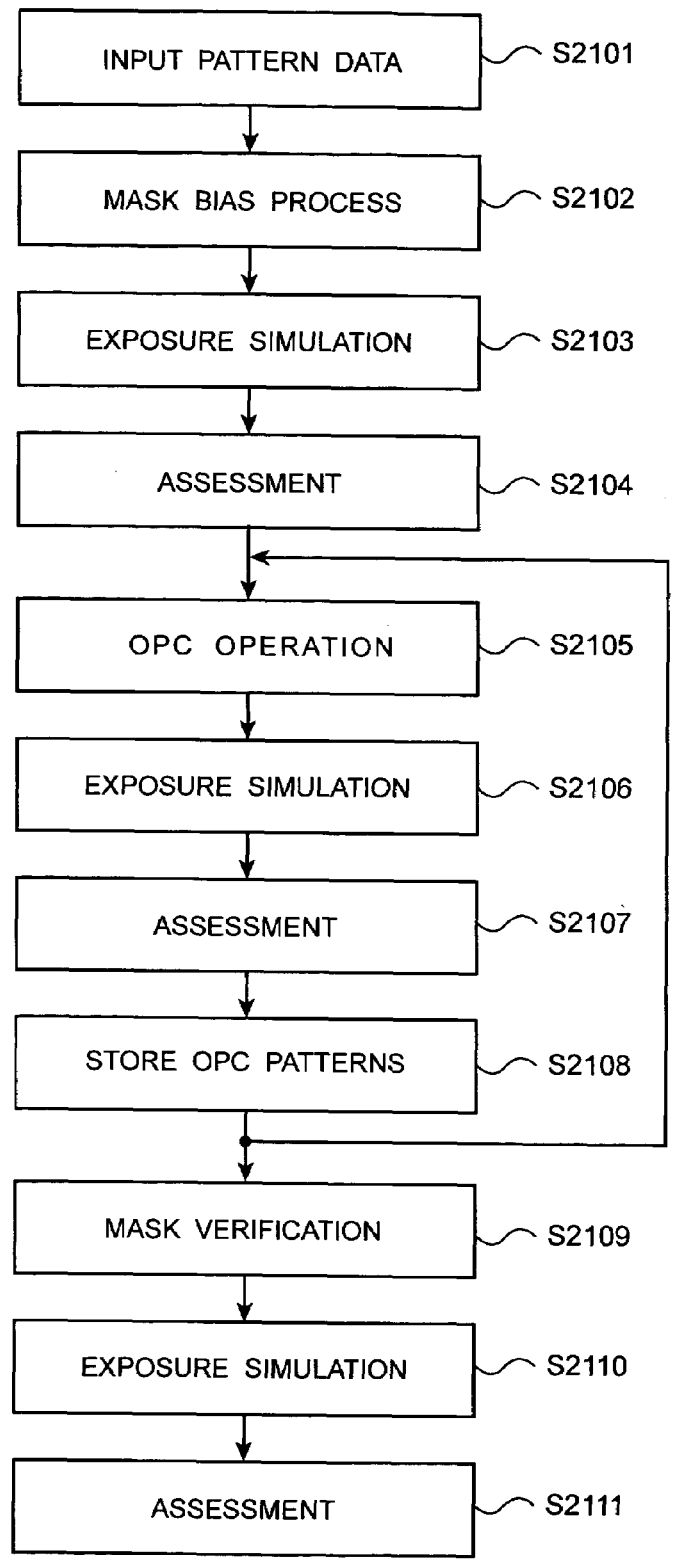
FIG. 20 is an operation flow chart of a prior art method of an OPC operation.

FIG. 19 is an operation flow chart for layout engineers to review OPC operations by means of a method of verifying photomask-pattern-correction results and/or a photomask-pattern-correction-result-verification device in accordance with the second embodiment of the present invention. A layout pattern is read in for the review of such OPC operations (Step S301).

Next, a parameter input unit is accessed (Step S302). Details of the parameter input unit are substantially the same as those of the first embodiment and omitted here, accordingly.

Parameters are then read in from a layout-pattern-storage section (Step S303). A subject region is designated for the photomask-pattern-correction-result-verification operation (Step S304). One or more functions are selected from the six functions for the photomask-pattern-correction-result-verification operation and are instructed of the execution of such selected functions (Step S305). At this time, parameters required for each function are provided to the photomask-pattern-correction-result-verification device.

Here, each function and its designated parameters have been described in the first embodiment and are omitted accordingly. Next, functions selected by the function selector are executed (Step S306). Their results are displayed on the device designated in result display operation 406 and are then checked (Step S307). The operation is returned to subject-region-designation (Step S304) again if the review of the OPC operations is required for the other regions. Thus, the operation is repeated up to Step S307. The operation is terminated, however, if such repetitions are unnecessary.

As described above, when lithography engineers read in parameters released for lithography conditions already determined and design photomask patterns for a specific process, necessary functions are accessed and executed through an integrated user interface so that storing operations of executed results, finally determined parameters and the like are automatically performed.

The methodologies described above in the embodiments can be performed by storing computer-executable programs at memory media, such as magnetic discs, optical discs and semiconductor memories, and by applying the same to various devices or by transmitting the programs for various devices to carry out. Computers or hardware sections execute the operations of the present invention set forth so far by reading in the programs stored at the memory media and by controlling functions in response to the programs.

As described above, according to the embodiments of the present invention, since parameters or models required for layout patterns and photomask-data-correction operations are stored at a database section, a series of operations from the input of layout patterns through photomask-pattern-correction-result verification are integrated into one syatem so that any persons skilled in the lithography art can use the functions. Further, since frequently accessed and heavily loaded sections, such as transformation ones for OPC input files, exposure simulation and integrated formats, are automated, functions for the trace of ED trees and margin curves and those for photoresist pattern-size measurement are assembled for design engineers to make use of them so that their load for photomask-pattern-correction-verification can be substantially lightened.

The present invention is not limited to the embodiments described above. Although the invention has been described in its applied form with a certain degree of particularity, it is understood that the present disclosure of the preferred form can be changed in the details of construction and the combination and arrangement of components may be resorted to without departing from the spirit and the scope of the invention as hereinafter claimed. Some components of the embodiments may be eliminated or various components from different embodiments may also be combined.

What is claimed is:

1. A method of verifying photomask-pattern-correction results, comprising:
    cutting away photomask patterns of a region to be subjected to correction;
    forming photoresist models used for execution of an optical-proximity effect-correction operation;
    executing said optical-proximity-effect-correction operation of said photomask patterns with respect to said photoresist models;
    executing an exposure simulation for simulating photoresist patterns formed on a photoresist film to which said photomask patterns are transferred after said optical-proximity-effect-correction operation;

designating lithographic parameters required for executions of said cutting away said photomask patterns of said region, said forming of said photoresist models, said optical-proximity-effect-correction operation, and said exposure simulation;

measuring sizes of said photoresist patterns subjected to said exposure simulation;

plotting exposure defocus trees and margin curves to show a relationship between exposure doses and defocus distances so that said photoresist patterns to which said photomask patterns are transferred after said optical-proximity-effect-correction operation are in a predetermined size;

detecting deviations of said photoresist patterns from originally designed photomask patterns with respect to said photomask patterns after said optical-proximity-effect-correction operation; and designating lithographic parameters required for said measuring of said sizes of said photoresist patterns, said plotting of said exposure defocus trees and margin curves, and said detecting of said deviations, wherein said detecting of said deviations is executed before said executing of said exposure simulation, said measuring of said sizes of said photoresist patterns and said plotting of said exposure defocus trees and margin curves.

2. A photomask-pattern-correction-result-verification device, comprising:

a cutting unit configured to cut away photomask patterns of a region to be subjected to correction;

a photoresist-model formation unit configured to form photoresist models to be subjected to an optical-proximity-effect-correction operation;

a correction operation unit configured to execute said optical-proximity-effect-correction operation of said photomask patterns with respect to said photoresist models;

an exposure simulation unit configured to simulate photoresist patterns formed on a photoresist film to which said photomask patterns are transferred after said optical-proximity-effect-correction operation;

a parameter designating unit configured to designate lithographic parameters required for said cutting unit, said photoresist-model formation unit, said correction operation unit, and said exposure simulation unit;

a measurement unit configured to measure sizes of said photoresist patterns subjected to said exposure simulation;

a detection unit configured to detect deviations of said photoresist patterns from originally-designed-photomask-patterns with respect to said photomask patterns subjected to said optical-proximity-effect-correction operation; and a parameter designating unit configured to designate lithographic parameters required for said measurement unit and said detection unit, wherein said detection unit detects deviations of said photoresist patterns from said originally-designed-photomask-patterns before said exposure simulation unit simulates said photoresist patterns formed on said photoresist film and said measurement unit measures said sizes of said photoresist patterns, and said plotter plots said exposure defocus tress and margin curves.

3. A photomask-pattern-correction-result-verification device according to claim 2, further comprising:

a measurement unit configured to measure sizes of said photoresist patterns subjected to said exposure simulation;

a detection unit configured to detect deviations of said photoresist patterns from originally designed photomask patterns with respect to said photomask patterns subjected to said optical proximity effect correction operation;

a plotter configured to plot exposure defocus trees and margin curves to show a relationship between exposure doses and defocus distances so that said photoresist patterns to which said photomask patterns are transferred after said optical-proximity-effect-correction operation are in a predetermined size; and a parameter designating unit configured to designate parameters required for said measurement unit, said detection unit and said plotter.

* * * * *